(12) United States Patent
Huang et al.

(10) Patent No.: US 7,476,591 B2
(45) Date of Patent: Jan. 13, 2009

(54) LATERAL POWER MOSFET WITH HIGH BREAKDOWN VOLTAGE AND LOW ON-RESISTANCE

(75) Inventors: Tsung-Yi Huang, Hsin-Chu (TW); Puo-Yu Chiang, Su-ao Township (TW); Ruey-Hsin Liu, Hsin-Chu (TW); Shun-Liang Hsu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 271 days.

(21) Appl. No.: 11/581,178

(22) Filed: Oct. 13, 2006

(65) Prior Publication Data

US 2008/0090347 A1  Apr. 17, 2008

(51) Int. Cl.
*H01L 21/336* (2006.01)
(52) U.S. Cl. .............................. 438/286; 257/E21.427
(58) Field of Classification Search ................ 438/282, 438/286, 307, 529, 545, 546; 257/E21.427
See application file for complete search history.

(56) References Cited

U.S. PATENT DOCUMENTS 5,306,652 A * 4/1994 Kwon et al. ................ 438/283
6,486,034 B1 * 11/2002 Huang et al. ............... 438/281
6,713,331 B2 * 3/2004 Nishibe et al. ............. 438/197

OTHER PUBLICATIONS

Imam, M., et al., "Design and Optimization of Double-RESURF High-Voltage Lateral Devices for a Manufacturable Process," IEEE Transactions on Electron Devices, vol. 50, No. 7, Jul. 2003, pp. 1697-1701.
Kim, M-H, et al., "A Low On- Resistance 700V Charge Balanced LDMOS with Intersected Well Structure," New Technology Development Team, Fairchild Semiconductor, bull5039@fairchildsemi.co.kr, ESSDERC 2002, pp. 367-370.
Quddus, M., et al., "Drain Voltage Dependence of On Resistance in 700V Super Junction LDMOS Transistor," Proceedings of 2004 International Symposium on Power Semiconductor Devices & ICs, Kitakyushu, pp. 201-204.
Disney, D.R., et al, "A new 800V lateral MOSFET with dual conduction paths," Proceedings of 2001 International Symposium on Power Semiconductor Devices & ICs, Osaka, pp. 399-402.

(Continued)

*Primary Examiner*—Chandra Chaudhari
(74) *Attorney, Agent, or Firm*—Slater & Matsil, L.L.P.

(57) ABSTRACT

A semiconductor device with high breakdown voltage and low on-resistance is provided. An embodiment comprises a substrate having a buried layer in a portion of the top region of the substrate in order to extend the drift region. A layer is formed over the buried layer and the substrate, and high-voltage N-well and P-well regions are formed adjacent to each other. Field dielectrics are located over portions of the high-voltage N-wells and P-wells, and a gate dielectric and a gate conductor are formed over the channel region between the high-voltage P-well and the high-voltage N-well. Source and drain regions for the transistor are located in the high-voltage P-well and high-voltage N-well. Optionally, a P field ring is formed in the N-well region under the field dielectric. In another embodiment, a lateral power superjunction MOSFET with partition regions located in the high-voltage N-well is manufactured with an extended drift region.

20 Claims, 12 Drawing Sheets

OTHER PUBLICATIONS

Hossain, Z., et al., "Field-plate Effects on the Breakdown Voltage of an Integrated High-voltage LDMOS Transistor," Proceedings of 2004 International Symposium on Power Semiconductor Devices & ICs, Kitakyushu, pp. 237-240.

Nezar, A., et al., "Breakdown Voltage in LDMOS Transistors Using Internal Field Rings," IEEE Transactions on Electron Devices, vol. 38, No. 7, Jul, 1991, pp. 1676-1680.

* cited by examiner

US 7,476,591 B2

LATERAL POWER MOSFET WITH HIGH BREAKDOWN VOLTAGE AND LOW ON-RESISTANCE

TECHNICAL FIELD

This invention relates generally to semiconductor structures and methods, and more particularly to a lateral power metal oxide semiconductor field effect transistor (MOSFET).

BACKGROUND

A lateral power MOSFET is basically a metal oxide semiconductor field effect transistor fabricated with coplanar drain and source regions. FIG. 1A shows a lateral power MOSFET device 100 in the prior art. The device 100 is formed on a p-type substrate 101 and another p-layer 113 is epitaxially grown on the substrate 101. A high-voltage P-well 115 is adjacent a high-voltage N-well 103 in the epitaxially grown p-layer 113. An N+ source 117 is positioned in the high-voltage P-well 115 such that the N+ source 117 is not immediately adjacent the high-voltage N-well 103, and an N+ drain 105 is positioned in the high-voltage N-well 103. Dielectrics 121 are formed to isolate and define areas such as the N+ source 117 and the N+ drain 105 of the device 100. A gate dielectric 111 and a gate electrode 110 are formed extending from the source 117 to a portion of the field dielectric 107. The device 100 also includes a P+ area 119 located in the high-voltage P-well 115. Applying a positive voltage to the gate electrode 110 induces a current to flow through the channel from the N+ source 117 into the high-voltage N-well 103 to be collected at the N+ drain 105.

A problem with this type of lateral power MOSFET is that it cannot maintain a low on-resistance when a high voltage is passed through the lateral power MOSFET. The on-resistance is the power of the current that is transformed into heat as the current travels through the device. The larger the on-resistance of the device, the less efficient the device. Accordingly, it is desired to reduce this resistance as much as possible for a more efficient device.

FIG. 1B illustrates another device 150 known in the prior that is designed to mitigate this problem. Device 150 is similar to device 100 of FIG. 1A, wherein like reference numerals refer to like elements, except a field ring 109 has been added. The field ring 109 works to reduce the surface electrical field and improves the depletion capability of the drift region. As a result, the doping concentration of the drift region can be increased and the on-resistance of the device 100 can be decreased.

Another problem with the prior art device 100 (shown in FIG. 1A) and the prior art device 150 (shown in FIG. 1B) is that the breakdown voltage is not as high as desired. The breakdown voltage is the voltage at which a normally high-resistance element (such as a MOS capacitor or reverse biased p-n junction) allows current to flow. When voltage larger than the breakdown voltage is passed through devices such as device 100 and device 150, catastrophic and irreversible damage is done to the devices, rendering the devices commercially useless and requiring the devices to be replaced. Accordingly, increasing the breakdown voltage is highly desirable.

FIG. 2 is a lateral power MOSFET designed to increase the breakdown voltage of the device 200. In FIG. 2 the field dielectrics have been removed from view for clarity. In this device 200 partition regions 201 have been placed into the high-voltage N-well 103, as shown in FIG. 2, such that there are areas of alternating conductivity in the high-voltage N-well region. This type of configuration is known in the art as a superjunction. The partition regions 201 work to increase the horizontal depletion capability of the drift region, which allows for a higher concentration of doping in the drift region. This helps to increase the breakdown voltage and works to reduce the specific on-resistance of the device.

Those prior art systems, however, have difficulties sustaining high voltage and low on-resistance, thus, an improved lateral power MOSFET is needed for a reduced on-resistance and a higher breakdown voltage when the device is placed under a high voltage.

SUMMARY OF THE INVENTION

These and other problems are generally solved or circumvented, and technical advantages are generally achieved, by embodiments of the present invention that allow for an extended drift region in a lateral power MOSFET that has a reduced on-resistance and an increased breakdown voltage when the device is placed under high voltage.

One aspect of the present invention is a semiconductor device that has a substrate with an extended drift region that has a first conductivity type. A first region of the first conductivity type is located above the extended drift region. A second region of first semiconductor material is located adjacent to, and forms a junction with, the first region, to form the channel of the device. Field dielectrics are located over the first region and the second region. A gate dielectric and a gate electrode overlie and extend from a portion of the field dielectric to a portion of the second region. Finally, source and drain regions are located within the first and second regions.

Another aspect of the present invention is a lateral power metal oxide semiconductor that is similar to the device described above, but additionally includes a field ring located under the field dielectric. The field ring has the second conductivity type.

Yet another aspect of the present invention is a lateral power superjunction metal oxide semiconductor field effect transistor. This embodiment is similar to the previously described first embodiment (including the extended drift region). However, a plurality of partition regions of second conductivity type is located in the first region. This plurality of partition regions is arranged in the first region in such a way as to form alternating areas of opposite conductivity in the first region, in order to form a superjunction.

By using these configurations in semiconductor devices and lateral power MOSFETs that have an extended drift region, the on-resistance of the device is reduced and the breakdown voltage of the device is increased. These all work to improve the performance and efficiency of the semiconductor device.

DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention is a semiconductor device with a reduced on-resistance and an increased breakdown voltage when the device is under a large voltage. Embodiments of the present invention may be useful for lateral power MOSFETs, particularly when the device is under a large voltage. In an embodiment discussed herein, a voltage of about 800 V is large. However, voltages greater than or less than 800 V may be considered large in other embodiments of the present invention. The manufacturing process of this device is detailed in the following paragraphs.

Figure 1A:
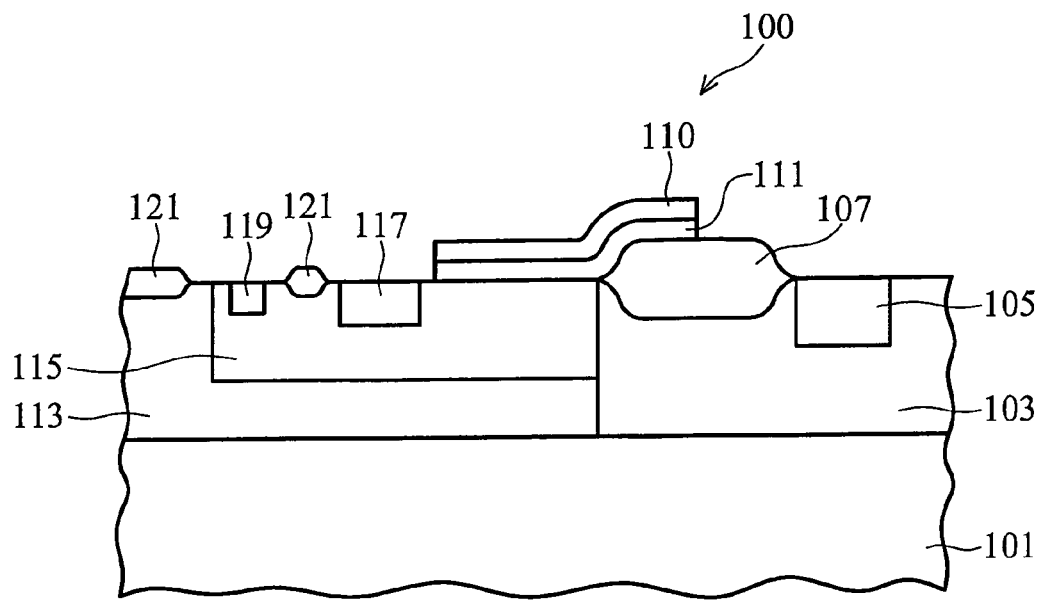
FIG. 1A is a cross-sectional view of a lateral power MOSFET in the prior art.
Figure 1B:
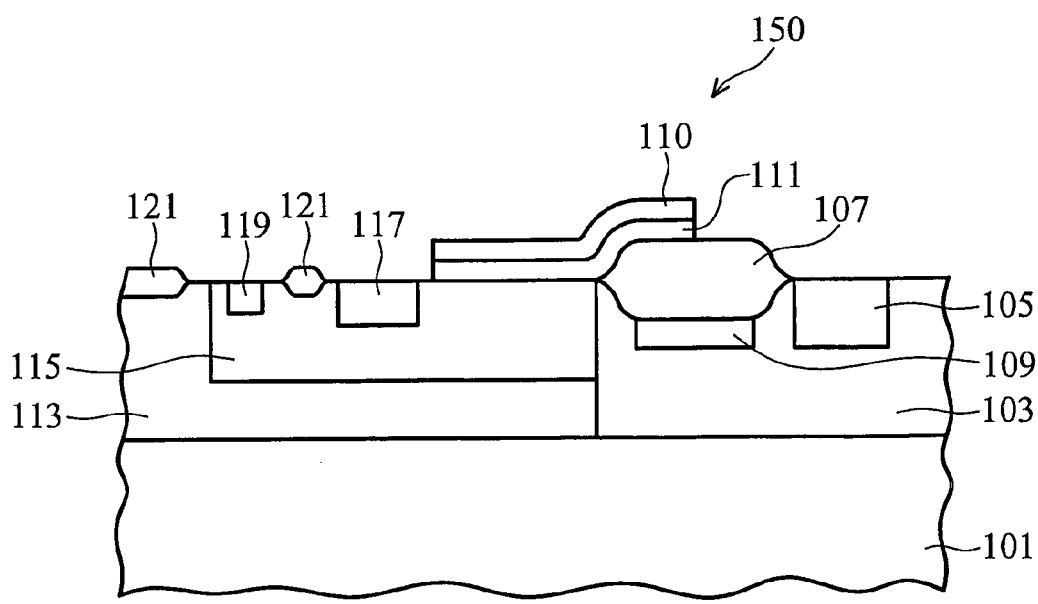
FIG. 1B is a cross-sectional view of a lateral power MOSFET with a field ring in the prior art.
Figure 2:
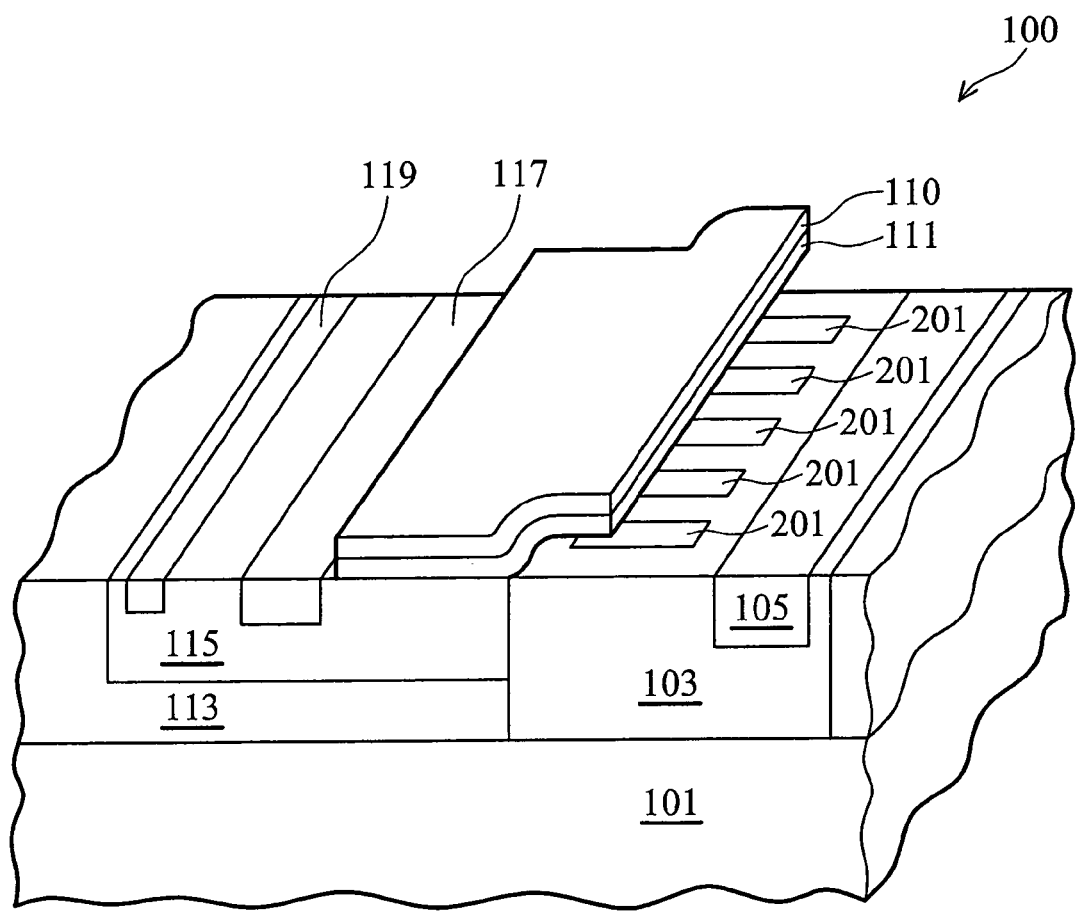
FIG. 2 is a perspective view of a lateral power superjunction MOSFET in the prior art.
Figure 3A:
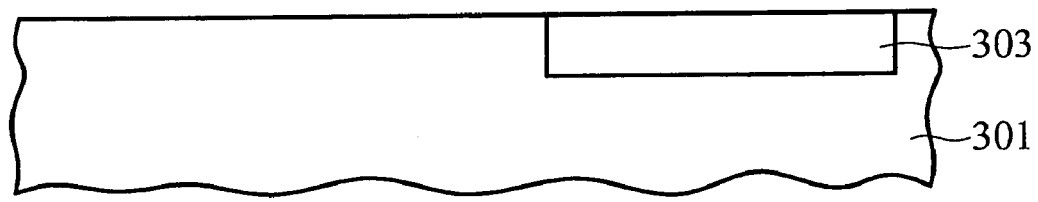
FIGS. 3A-3G are cross-sectional views of various steps of a method of manufacturing of a MOSFET in which an extended drift region is incorporated into a lateral power MOSFET, in accordance with an embodiment of the present invention.

Referring first to FIG. 3A, a substrate 301 is provided in accordance with an embodiment of the present invention. The substrate 301 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

An N+ buried layer (NBL) 303 is formed in a portion of the substrate 301 proximate the top surface of the substrate 301. The NBL 303 is preferably formed by implanting n-type dopants into the upper region of the substrate 301. For example, the NBL 303 may be formed by implanting an n-type dopant such as phosphorous at a concentration of between about $3 \times 10^{15}$ and about $3 \times 10^{16}$, and a voltage level of between about 20 to about 200 keV. However, other n-type dopants, such as arsenic, nitrogen, antimony, combinations thereof, or the like could alternatively be used. The n-type dopant of the NBL 303 may then be driven into the substrate 301 by heating the substrate 301 to a temperature of about 1,000° C. to about 1,200° C. The NBL 303 formed preferably comprises a thickness of between about 2 μm and 10 μm, and more preferably has a thickness of about 6 μm, for example.

Figure 3B:
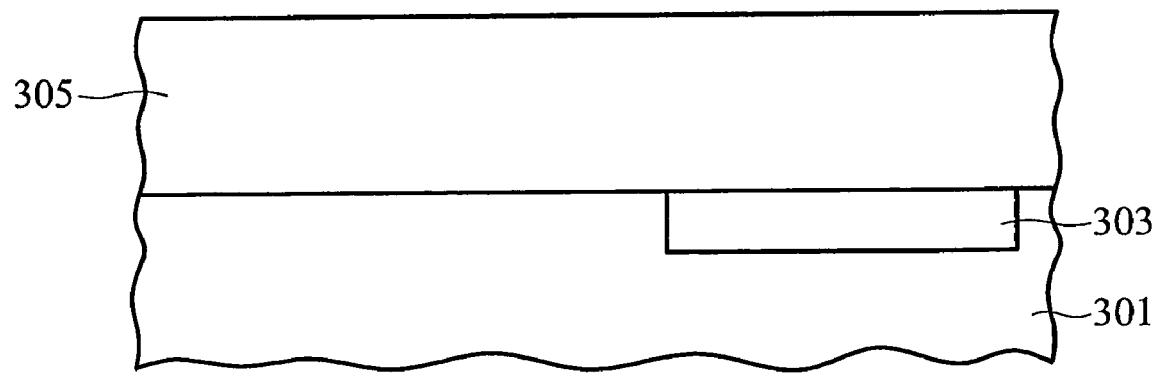

FIG. 3B illustrates a doped semiconductor material 305 being formed over the substrate 301 and the NBL 303 in accordance with an embodiment of the present invention. The doped semiconductor material 305 preferably comprises a P-type semiconductor such as silicon. The doped semiconductor material 305 is preferably formed epitaxially, although other methods may alternatively be used. The doped semiconductor material 305 is referred to herein as a P-epi layer or P-epitaxial layer. Preferably, the P-epi layer 305 is formed in a thickness between about 2 μm and about 5 μm, and more preferably to a thickness of about 4 μm in an embodiment; however, other thicknesses may be used. The P-epi layer 305 may be doped with boron, for example, although other p-type dopants such as gallium, aluminum, indium, combinations thereof, or the like may alternatively be used.

Figure 3C:
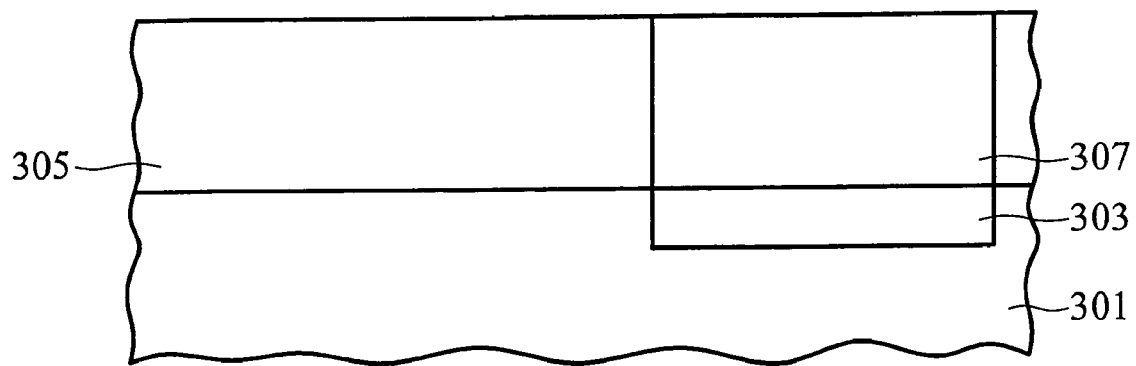

FIG. 3C illustrates the formation of a high-voltage N-well region 307 in accordance with an embodiment of the present invention. The high-voltage N-well region 307 may be formed by implanting an n-type dopant such as phosphorous to a concentration of about $3 \times 10^{15}$ to about $3 \times 10^{16}$ dopant concentration at about 180 KeV, for example. However, other n-type dopants such as arsenic, nitrogen, antimony, combinations thereof, or the like, could alternatively be used. In an embodiment, the high-voltage N-well region 307 has a thickness of about between about 4 μm and about 10 μm, and a preferred thickness of 4 μm.

Figure 3D:
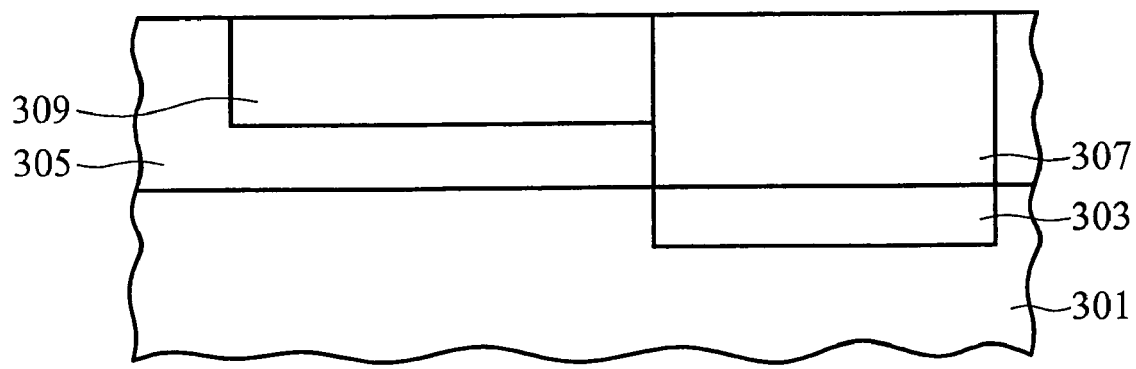

FIG. 3D illustrates the formation of the high-voltage P-well 309 in accordance with an embodiment of the present invention. Preferably, the high-voltage P-well 309 is formed substantially adjacent to the high-voltage N-well 307, such that a junction between the two wells is created. The high-voltage P-well 309 may be formed by doping at least a portion of the P-epi layer 305 with a p-type dopant such as boron at a concentration of between about $1 \times 10^{15}$ to about $2 \times 10^{16}$ at a power of about 100 keV, as an example. In an embodiment, the high-voltage P-well 309 has a depth of between about 2 μm to about 6 μm, with a preferred depth of about 4 μm. However, other p-type dopants such as gallium, aluminum, indium, combinations thereof, or the like could alternatively be used.

Figure 3E:
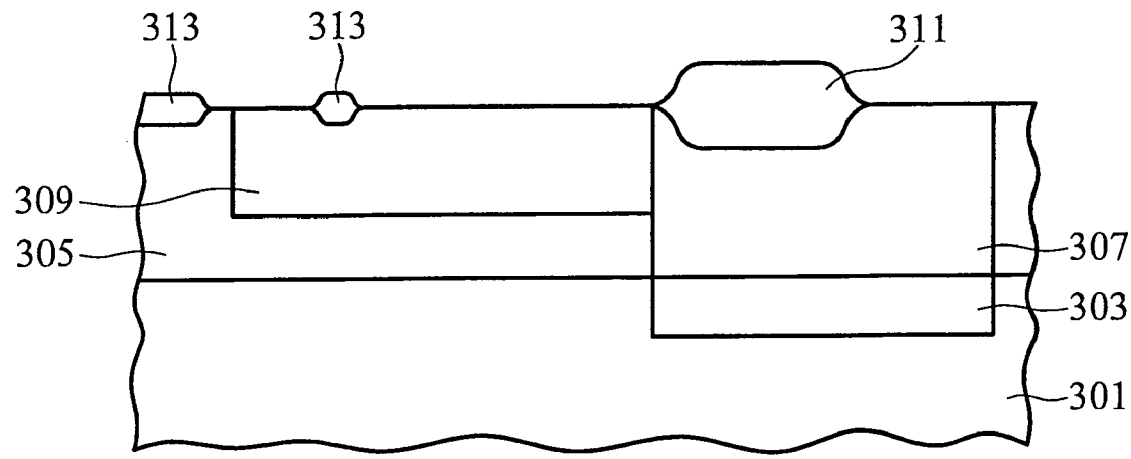

FIG. 3E illustrates the formation of a first field dielectric 311 and a group of second field dielectrics 313 in accordance with an embodiment of the present invention. The first field dielectric 311 is formed over a portion of the high-voltage N-well 307. The second field dielectrics 313 are formed over portions of the high-voltage P-well 309 and the P-epi layer 305, as shown in FIG. 3E. In an embodiment of the present invention the first field dielectric 311 and the second field dielectric 313 are preferably formed simultaneously. The first field dielectric 311 and second field dielectric 313 may comprise silicon dioxide, formed by patterning a masking layer (not shown) to expose portions of the substrate 301 at which the first field dielectric 311 and the second field dielectrics 313 are desired, heating the substrate 301 in the presence of oxygen at a temperature of about 980° C., and then removing the masking layer. The first field dielectric 311 and the second field dielectric 313 preferably comprise a thickness of between about 3,000 Å and about 7,000 Å, with a preferred thickness of about 5,000 Å, for example. However, the first field dielectric 311 and second field dielectric 313 may alternately comprise other thicknesses and materials.

Figure 3F:
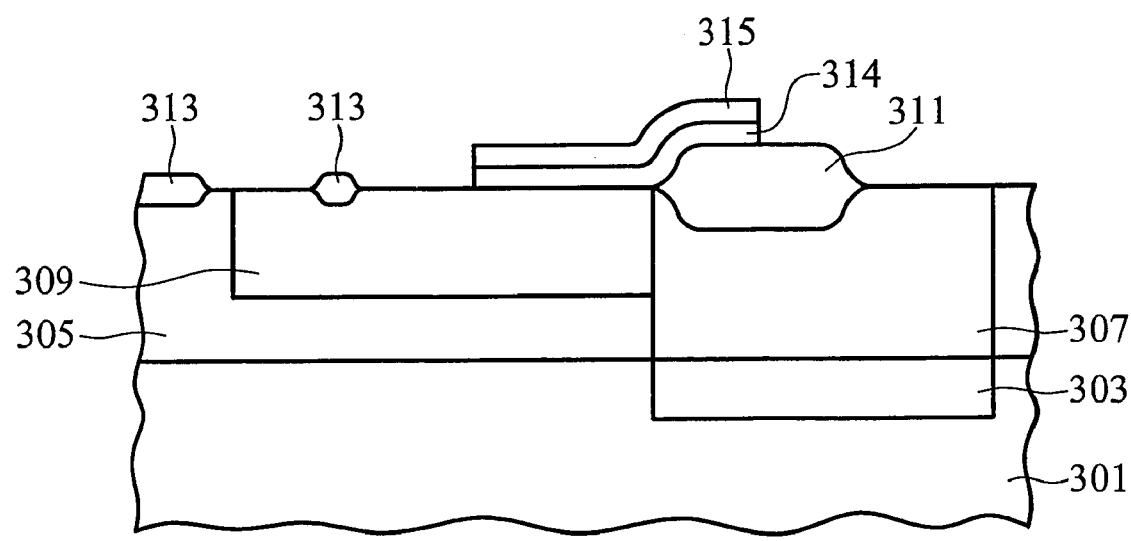

FIG. 3F shows the formation of a gate dielectric 314 and a gate conductor 315 in accordance with an embodiment of the present invention. The gate dielectric 314 is deposited over an upper portion of the field dielectric 311 and extends to cover portions of the high-voltage P-well region 309. A gate conductor 315 is deposited over the gate dielectric 314. The gate conductor 315 comprises a conductive layer such as a doped polysilicon, metal, metal alloy or the like. Optionally, a surface of the gate conductor 315 may be silicided.

Figure 3G:
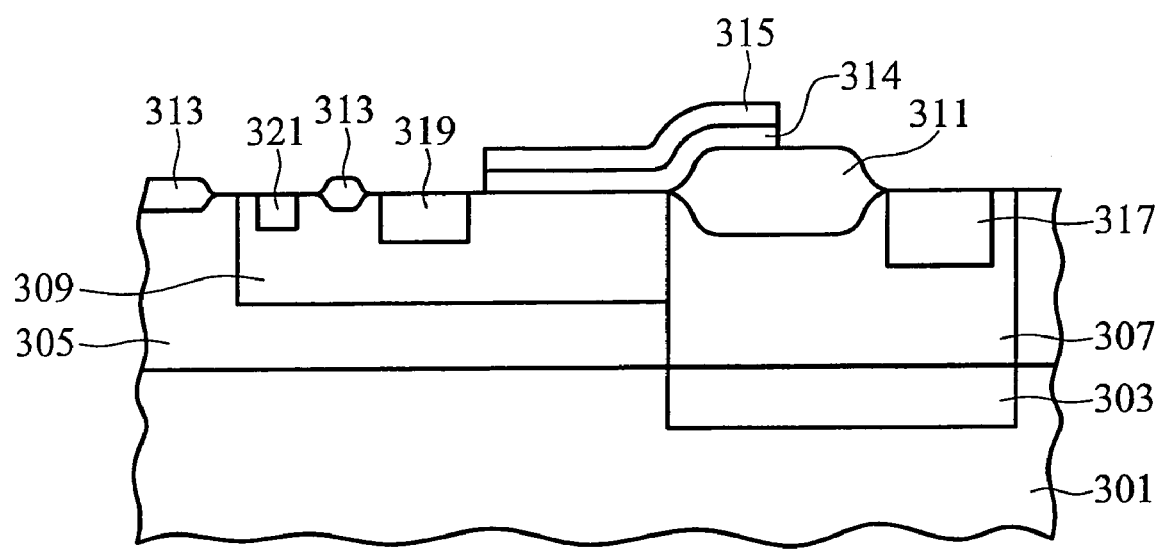

FIG. 3G illustrates the formation of a source region 319 in the high-voltage P-well region 309 and a drain region 317 in the high-voltage N-well region 307. The source region 319 and the drain region 317 can be formed by implanting an n-type dopant such as phosphorous at a concentration of between about $1\times10^{19}$ and about $2\times10^{20}$ at about 80 KeV, as examples. However, other n-type dopants such as arsenic, nitrogen, antimony, combinations thereof, or the like could alternatively be used.

FIG. 3G also shows the formation of a P+ region 321 that can be formed in the high-voltage P-well region 309. The p-type dopant may be boron implanted at a concentration of between about $1\times10^{19}$ and about $2\times10^{20}$ at about 70 keV, as an example. Other p-type dopants such as gallium, aluminum, indium, combinations thereof, or the like could alternatively be used.

Optionally, the dimensions and dopant concentrations of the substrate 301, the NBL 303, and the high-voltage N-well region 307 can be set in accordance with the reduced surface field (RESURF) technique, such that the substrate 301, the NBL 303, and the high-voltage N-well region 307 form a single RESURF structure, as is known in the art. This structure reduces the electric field at the junction of the high-voltage P-well 309 and the high-voltage N-well 307, and allows for an even larger increased breakdown voltage of the overall device.

Figure 4A:
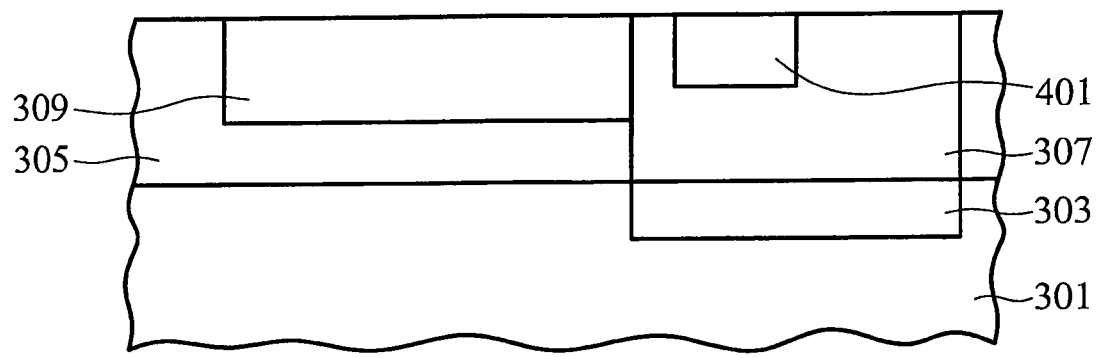
FIGS. 4A-4D are cross-sectional views of various stages of a method of manufacturing of a MOSFET in which an extended drift region is incorporated into a lateral power MOSFET that has a field ring, in accordance with an embodiment of the present invention.
Figure 4B:
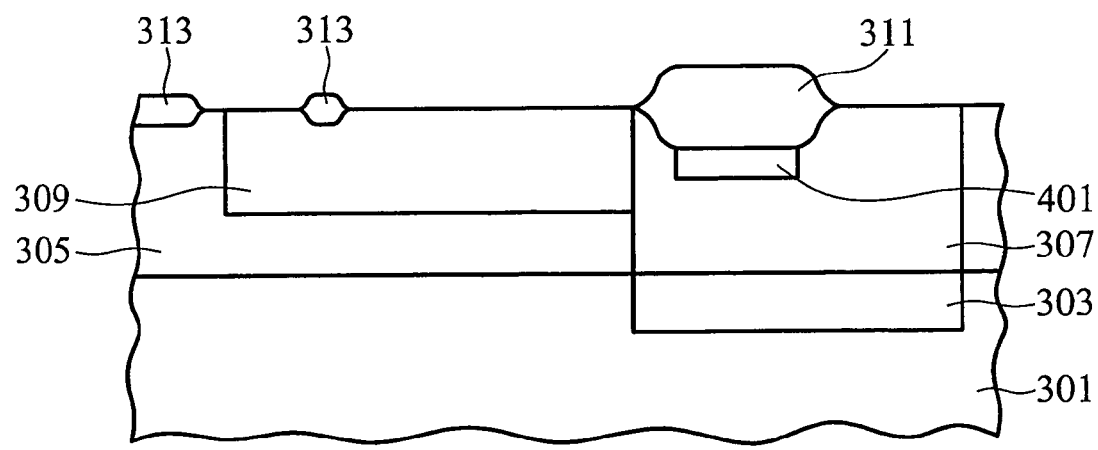
Figure 4C:
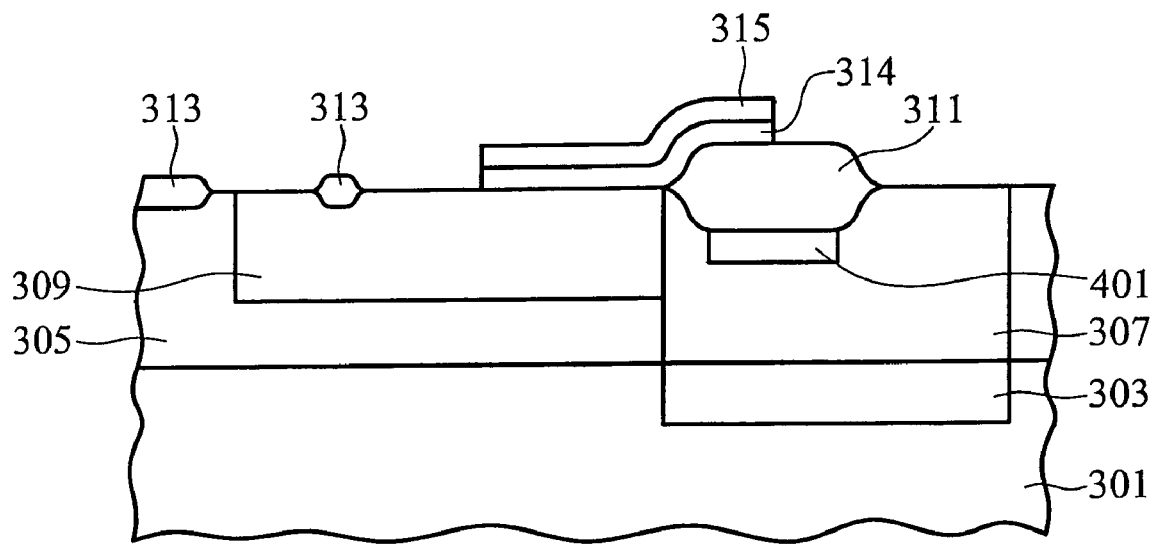

FIGS. 4A to 4C illustrate another embodiment of the present invention, in which a lateral power MOSFET that has a field ring is manufactured with an extended drift region in accordance with an embodiment of the present invention. In this embodiment the initial steps of the manufacturing process are similar to those shown in FIGS. 3A through 3D, wherein like reference numerals refer to like elements. However, FIG. 4A illustrates that a portion of the high-voltage N-well 307 is counter-doped with a p-type dopant to form a field ring 401. The field ring 401 may be formed by doping a portion of the high-voltage N-well 307 with a p-type dopant such as boron to a depth of between about 0.4 µm to about 2 µm, with a preferred depth of about 1 µm. However, other p-type dopants such as gallium, aluminum, indium, combinations thereof, or the like could alternatively be used.

FIG. 4B illustrates the formation of a first field dielectric 311 and a group of second field dielectrics 313 in accordance with an embodiment of the present invention. The first field dielectric 311 is formed over the field ring 401 and a portion of the high-voltage N-well 307. The second field dielectrics 313 are formed over portions of the high-voltage P-well 309 and the P-epi layer 305, as shown in FIG. 4B. The first field dielectric 311 and second field dielectric 313 may be formed as discussed above with reference to FIG. 3E.

FIG. 4C shows the formation of a gate dielectric 314 and a gate electrode 315 in accordance with an embodiment of the present invention. The gate dielectric 314 is deposited over the top surface of the field dielectric 311 and extends to cover a portion of the high-voltage P-well region 309, as shown in FIG. 4C. A gate electrode 315 is deposited over the gate dielectric 314. The gate electrode 315 and gate dielectric 314 may be formed as discussed above with reference to FIG. 3F.

Figure 4D:
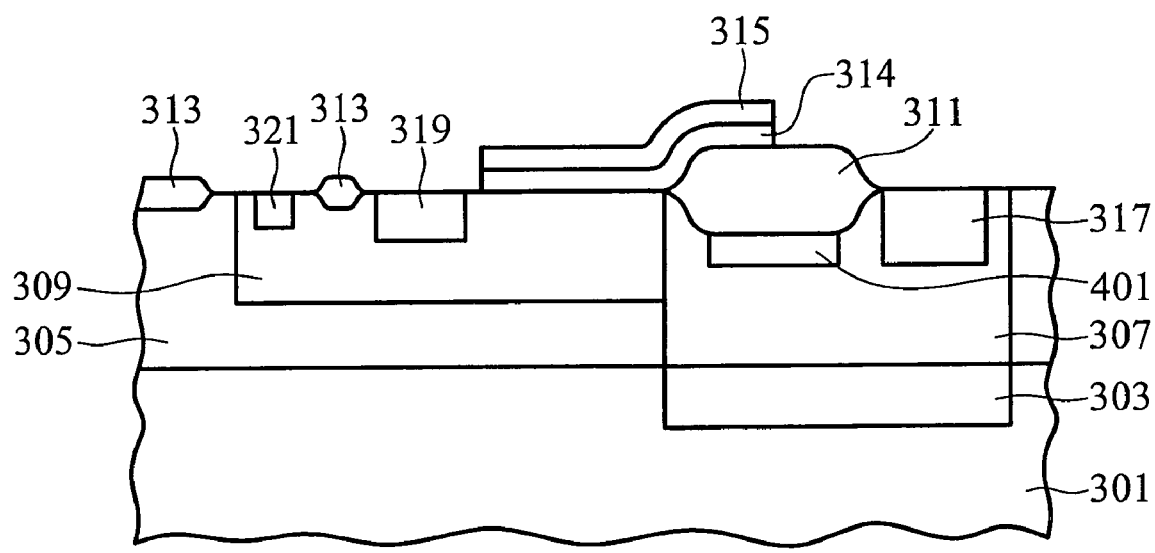

FIG. 4D illustrates the formation of a source region 319 in the high-voltage P-well region 309 and a drain region 317 in the high-voltage N-well region 307 in accordance with an embodiment of the present invention. The source and drain regions may be formed as discussed above with reference to FIG. 3G.

FIG. 4D also shows the formation of a P+ region 321 that will be formed in the high-voltage P-well region in accordance with an embodiment of the present invention. The P+ region 321 may be formed as discussed above with reference to FIG. 3G.

Optionally, the dimensions and dopant concentrations of the substrate 301, the NBL 303, the high-voltage N-well region 307, and the field ring 401 can be set in accordance with the reduced surface field (RESURF) technique, such that the substrate 301, the NBL 303, the high-voltage N-well region 307, and the field ring 401 form a double RESURF structure, as is known in the art. This structure reduces the electric field at the junction of the high-voltage P-well 309 and the high-voltage N-well 307, and allows for an even larger increased breakdown voltage of the overall device.

Figure 5A:
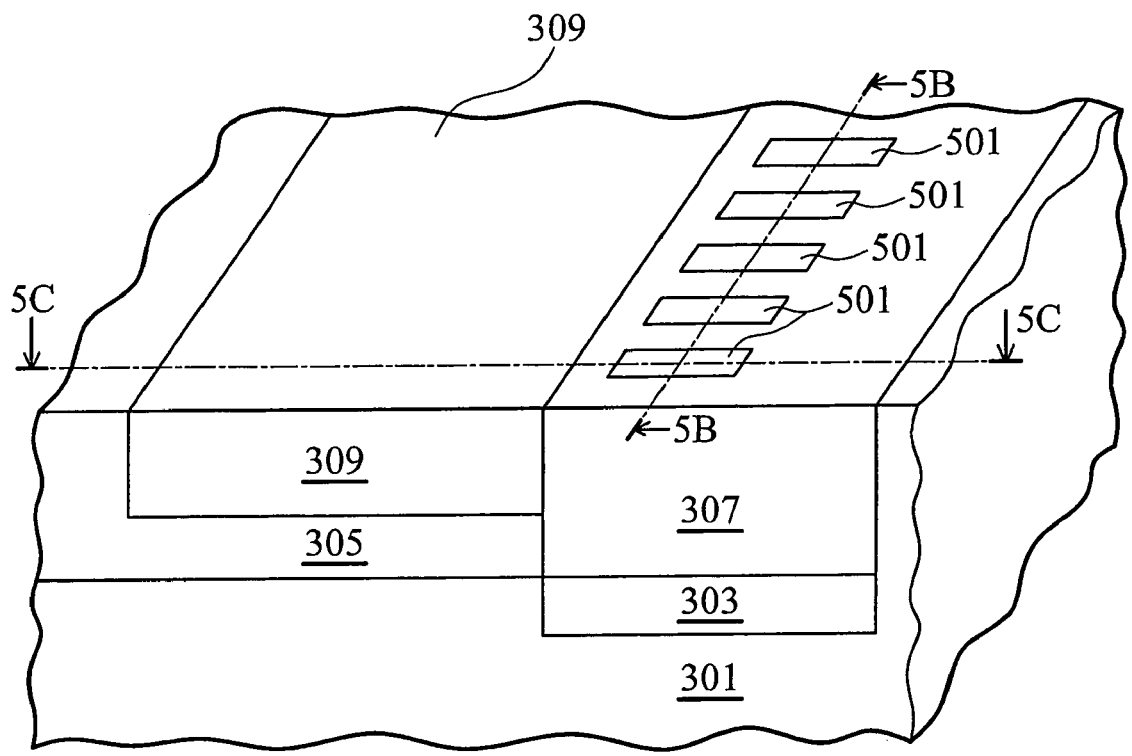
FIGS. 5A-5E are cross-sectional views of various steps of a method of manufacturing of a lateral power superjunction MOSFET in which an extended drift region is incorporated into a lateral power superjunction MOSFET, in accordance with an embodiment of the present invention.

FIGS. 5A-5E illustrate yet another embodiment of the present invention, in which a lateral power superjunction MOSFET is manufactured with an extended drift region. The initial steps of manufacturing this embodiment are similar to the methods as shown through FIGS. 3A-3D. FIG. 5A illustrates that, prior to the formation of the field dielectric 311, partition regions 501 are formed in the high-voltage N-well region 307 to form a superjunction MOSFET, as is known in the art. In this embodiment the partition regions are p-type conductive regions. These partition regions 501 can be formed through ion implantation of a p-type dopant such as boron at a concentration of between about $1\times10^{15}$ and about $2\times10^{16}$ at a power of about 70 keV and a subsequent thermal drive in. However, other p-type dopants such as gallium, aluminum, indium, combinations thereof, or the like could alternatively be used. In an embodiment the partition regions 501 have a depth of between about 0.5 µm and about 5 µm, with a preferred depth of about 3 µm.

Figure 5B:
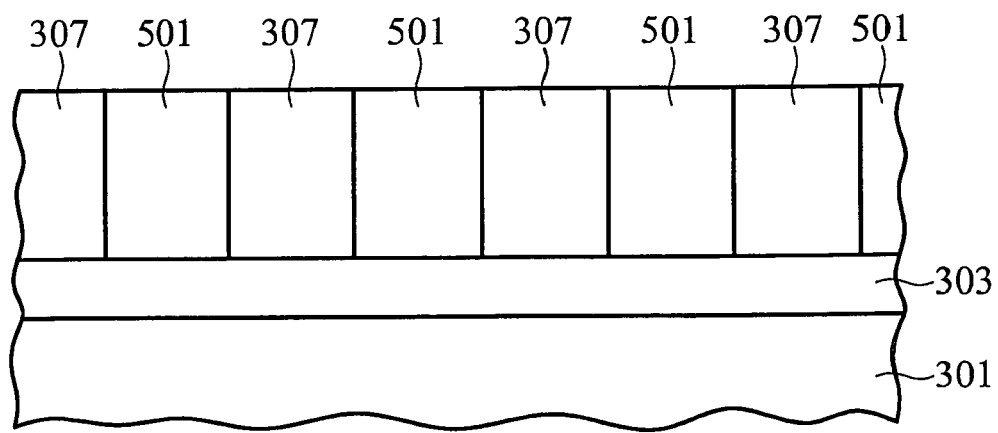

FIG. 5B illustrates another view of the superjunction partition regions 501 taken along the 5B-5B axis in FIG. 5A. In this view, it is shown that the partition regions 501 are interspaced within the high-voltage N-well region 307 to form alternating areas of opposite conductivity. The partition regions 501 preferably extend substantially through the P-epi layer 305 and do not extend into the NBL 303.

Figure 5C:
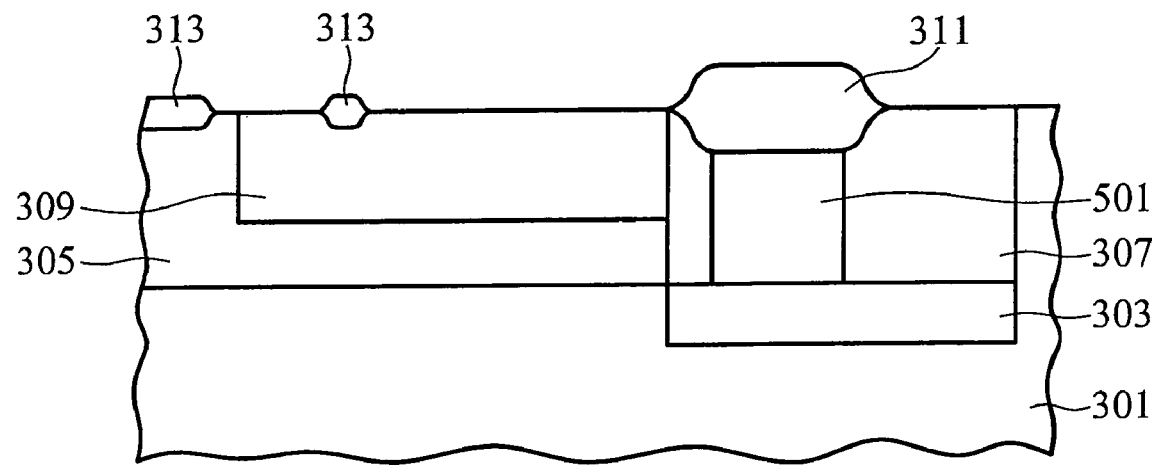

FIG. 5C illustrates the formation of a first field dielectric 311 and a group of second field dielectrics 313 once the partition regions 501 are formed in accordance with an embodiment of the present invention. FIG. 5C is a cross-sectional view taken along the 5C-5C axis in FIG. 5A after the formation of a first field dielectric 311 and second field dielectrics 313. The first field dielectric 311 is formed over a portion of the high-voltage N-well region 307 and portions of the partition regions 501. The second field dielectrics 313 are formed over portions of the high-voltage P-well 309 and the P-epi layer 305, as shown in FIG. 5B. The first field dielectric 311 may be formed as discussed above with reference to FIG. 3E.

Figure 5D:
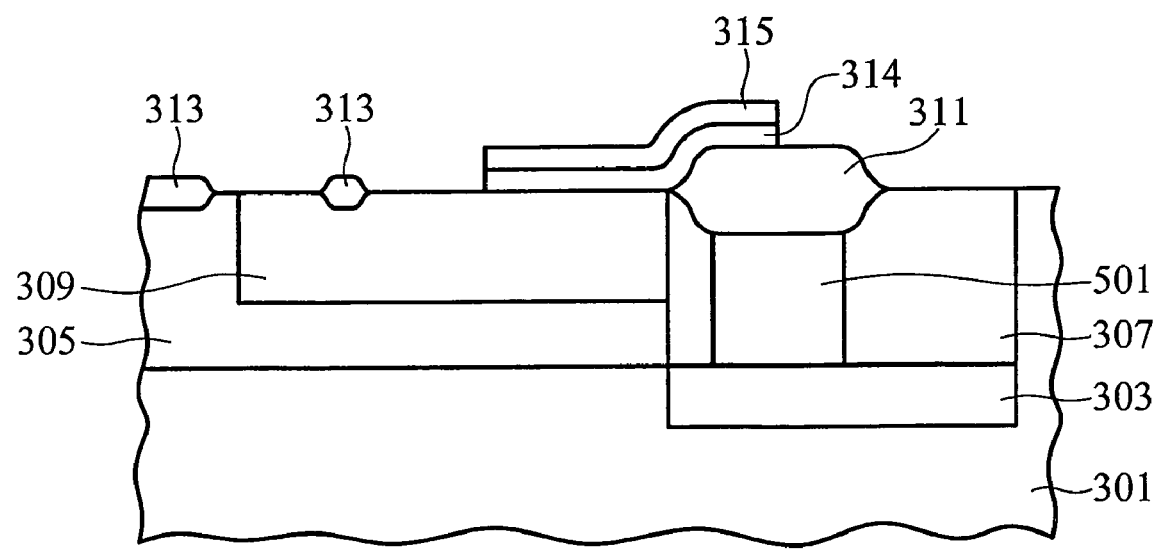

FIG. 5D shows the device of FIG. 5C after the formation of a gate dielectric 314 and a gate electrode 315 in accordance with an embodiment of the present invention. The gate dielectric 314 is deposited over the top surface of the field dielectric 311 and extends to cover portions of the high-voltage P-well region 309, as shown in FIG. 5C. The gate electrode 315 and gate dielectric 314 may be formed as discussed above with reference to FIG. 3F.

Figure 5E:
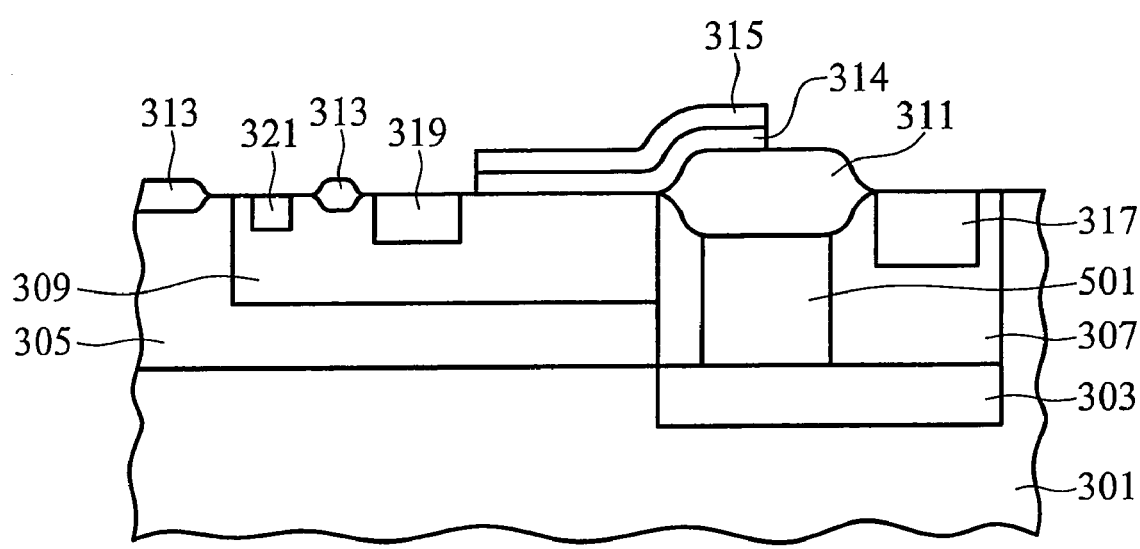

FIG. 5E illustrates the device of FIG. 5D after the formation of a source region 319 in the high-voltage P-well region 309 and a drain region 317 in the high-voltage N-well region 307 in accordance with an embodiment of the present invention. The source region 319 and drain region 317 may be formed as discussed above with reference to FIG. 3G.

FIG. 5E also shows the formation of a P+ region 321 that will be formed in the high-voltage P-well region. The P+ region 321 may be formed as discussed above with reference to FIG. 3G.

Figure 6:
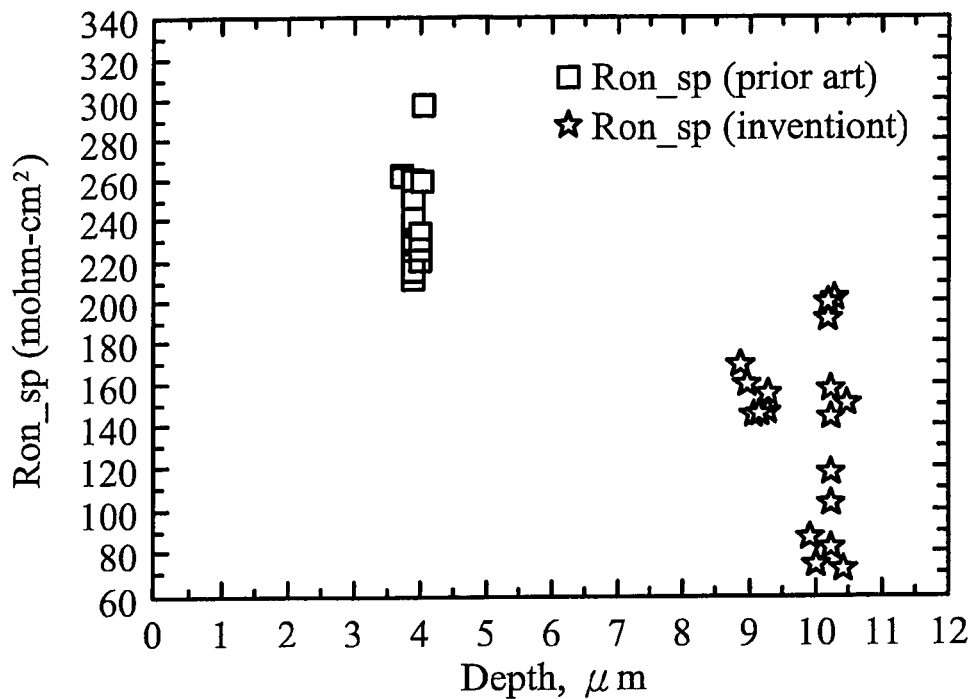
FIG. 6 is a comparison chart of the on-resistance versus the depth of the drift region in an embodiment of the present invention and traditional lateral power MOSFETS.

FIG. 6 is a chart that shows a comparison of the on resistance of a semiconductor device in relation to the depth of the drift region between an embodiment of the present invention and a traditional semiconductor device. As shown, an increase in the depth of the drift region from about 4 μm to about 10 μm may translate to about a 65% improvement of the on-resistance of the device.

Figure 7:
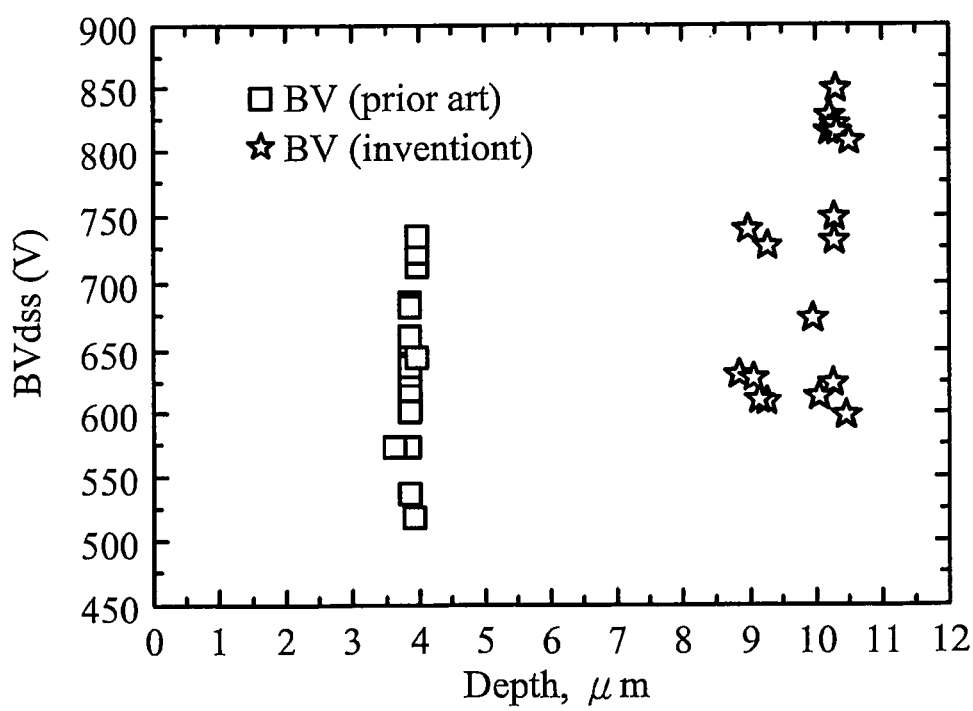
FIG. 7 is a comparison of the breakdown voltage versus the depth of the drift region in an embodiment of the present invention and traditional lateral power MOSFETS.

FIG. 7 is a chart that shows a comparison of the breakdown voltage of a semiconductor device in relation to the depth of the drift region between the present invention and a traditional semiconductor device. As shown, an increase in the depth of the drift region from about 4 μm to about 10 μm may lead to about a 15% improvement in the breakdown voltage over traditional lateral power MOSFETs.

As one of ordinary skill in the art will appreciate, embodiments as presented herein are merely illustrative embodiments of the present invention. For example, while the discussed embodiment is a p-type lateral power MOSFET, another embodiment could be an n-type lateral power MOSFET, with a n-type channel region, p-type source and drain regions, and a p-type extended drift region.

Although the present invention and its advantages have been described in detail, it should be understood that various changes, substitutions and alterations can be made herein without departing from the spirit and scope of the invention as defined by the appended claims. For example, there are multiple methods for the deposition of material as the structure is being formed. Any of these deposition methods that achieve substantially the same result as the corresponding embodiments described herein may be utilized according to the present invention.

Moreover, the scope of the present application is not intended to be limited to the particular embodiments of the methods described in the specification. As one of ordinary skill in the art will readily appreciate from the disclosure of the present invention, methods presently existing, or later to be developed, that perform substantially the same function or achieve substantially the same result as the corresponding embodiments described herein may be utilized according to the present invention. Accordingly, the appended claims are intended to include within their scope such methods.

What is claimed is:

1. A method of forming a semiconductor device, the method comprising:
providing a substrate with a first layer;
forming an extended drift region in an upper region of a portion of the first layer, the extended drift region comprising a first conductivity type;
forming a second layer over the extended drift region and the substrate;
forming a first region within the second layer and over the extended drift region, the first region comprising the first conductivity type;
forming a second region within the second layer and substantially adjacent to the first region in a plane that is substantially parallel to a major surface of the substrate, the second region comprising a second conductivity type;
forming a field dielectric over a portion of the first region; and
forming a gate dielectric and gate electrode such that the gate dielectric and gate electrode extend from over a portion of the field dielectric to over a portion of the second region.

2. The method of claim 1, wherein the first conductivity type is an n-type conductivity, and the second conductivity type is a p-type conductivity.

3. The method of claim 1, wherein the first conductivity type is a p-type conductivity, and the second conductivity type is an n-type conductivity.

4. The method of claim 1, wherein the first layer is epitaxially grown on the substrate.

5. The method of claim 1, wherein the extended drift region and the first region have a combined thickness greater than about 8 μm.

6. The method of claim 1, wherein the field dielectric comprises short trench isolation.

7. The method of claim 1, wherein forming a field dielectric is performed at least in part by local oxidation of silicon.

8. The method of claim 1, wherein the substrate, the extended drift region, and the first region have dimensions set according to the reduced surface field (RESURF) technique to form a single RESURF structure.

9. A method of forming a lateral diffused metal oxide semiconductor (LDMOS) device, the method comprising:
providing a substrate with a first layer;
forming an extended drift region in the top region of a portion of the first layer, the extended drift region comprising a first conductivity type;
forming a second layer over the extended drift region and the substrate;
forming a first region within the second layer and substantially aligned with the extended drift region, the first region comprising the first conductivity type;
forming a second region within the second layer and having a junction with the first region, the second region having a second conductivity type;
forming a drain region in the first region, the drain region having the first conductivity type;
forming a source region in the second region, the source region having the first conductivity type;
forming a field ring in the first region, interposed between, but not substantially adjacent to, the drain region and the second region, the field ring having a second conductivity type;
forming a field dielectric over a portion of the first region; and
forming a gate dielectric and gate electrode, such that the gate dielectric and gate electrode extend from over a portion of the field dielectric to over a portion of the second region.

10. The method of claim 9, wherein the first layer is epitaxially grown on the substrate.

11. The method of claim 9, wherein the extended drift region and the first region have a combined thickness of about 8 μm.

12. The method of claim 9, wherein the field dielectric comprises short trench isolation.

13. The method of claim 9, wherein forming a field dielectric is performed at least in part by local oxidation of silicon.

14. The method of claim 9, wherein the first conductivity type is a p-type conductivity, and the second conductivity type is an n-type conductivity.

15. The method of claim 9, wherein the first conductivity type is an n-type conductivity, and the second conductivity type is a p-type conductivity.

16. The method of claim 9, wherein the substrate, the first region, the second region, and the fourth region have dimensions set according to the reduced surface field (RESURF) technique to form a double RESURF structure.

17. A method of forming a lateral diffused superjunction metal oxide semiconductor (LDMOS) device, the method comprising:

providing a substrate with a first layer;

forming an extended drift region in a portion of the substrate, the extended drift region comprising a first conductivity type;

forming a second layer over the extended drift region and the substrate;

forming a first region within the second layer above and substantially aligned with the extended drift region, the first region comprising the first conductivity type;

forming a second region within the second layer and having a junction with the first region, the second region comprising a second conductivity type;

forming a drain region in the first region, the drain region having the first conductivity type;

forming a source region in the second region, the source region having the first conductivity type;

forming partition regions in the first region, the partition regions having the second conductivity type, such that the partition regions and the first region form areas of alternating conductivity type;

forming a field dielectric over a portion of the first region; and forming a gate dielectric and gate electrode, such that the gate dielectric and gate electrode extend from over a portion of the field dielectric to over a portion of the second region.

18. The method of claim 17, wherein the first conductivity type is a p-type semiconductor conductivity, and the second conductivity type is an n-type conductivity.

19. The method of claim 17, wherein the first conductivity type is an n-type conductivity, and the second conductivity type is a p-type conductivity.

20. The method of claim 17, wherein the first layer is epitaxially grown on the substrate and the extended drift region.

* * * * *